(12) United States Patent
Kumar

(10) Patent No.: US 7,829,471 B2
(45) Date of Patent: *Nov. 9, 2010

(54) CLUSTER TOOL AND METHOD FOR PROCESS INTEGRATION IN MANUFACTURING OF A PHOTOMASK

(75) Inventor: Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 993 days.

This patent is subject to a terminal disclaimer.

(21) Appl. No.: 11/192,989

(22) Filed: Jul. 29, 2005

(65) Prior Publication Data

US 2007/0026321 A1  Feb. 1, 2007

(51) Int. Cl.
*H01L 21/302* (2006.01)

(52) U.S. Cl. .............. 438/717; 438/714; 438/723; 430/323; 216/41

(58) Field of Classification Search .......... 438/706, 438/710, 712, 714, 717, 723; 216/41, 47; 430/5, 323

See application file for complete search history.

(56) References Cited

U.S. PATENT DOCUMENTS

| | | | |
|---|---|---|---|
| 4,579,618 A | 4/1986 | Celestino et al. |
| 4,585,516 A | 4/1986 | Corn et al. |
| 5,273,610 A | 12/1993 | Thomas, III et al. |
| 5,472,564 A | 12/1995 | Nakamura et al. |
| 5,512,130 A | 4/1996 | Barna et al. |
| 5,556,501 A | 9/1996 | Collins et al. |
| 5,689,215 A | 11/1997 | Richardson et al. |
| 5,889,252 A | 3/1999 | Williams et al. |
| 5,899,252 A | 5/1999 | Pozzo |
| 5,925,494 A | 7/1999 | Horn |
| 6,043,167 A | 3/2000 | Lee et al. |
| 6,060,132 A | 5/2000 | Lee |
| 6,089,181 A | 7/2000 | Suemasa et al. |
| 6,171,764 B1 | 1/2001 | Ku et al. |

(Continued)

FOREIGN PATENT DOCUMENTS

DE  10100822 A1  7/2002

(Continued)

OTHER PUBLICATIONS

Bencher, et al., "Dielectric Antireflective Coatings for DUV Lithography", Solid State Technology, Mar. 1997, 109, 111-112 and 114.

(Continued)

*Primary Examiner*—Lan Vinh
(74) *Attorney, Agent, or Firm*—Patterson & Sheridan, LLP

(57) ABSTRACT

A method and apparatus for process integration in manufacture of a photomask are disclosed. In one embodiment, a cluster tool suitable for process integration in manufacture of a photomask including a vacuum transfer chamber having coupled thereto at least one hard mask deposition chamber and at least one plasma chamber configured for etching chromium. In another embodiment, a method for process integration in manufacture of a photomask includes depositing a hard mask on a substrate in a first processing chamber, depositing a resist layer on the substrate, patterning the resist layer, etching the hard mask through apertures formed in the patterned resist layer in a second chamber; and etching a chromium layer through apertures formed in the hard mask in a third chamber.

3 Claims, 11 Drawing Sheets

U.S. PATENT DOCUMENTS

| | | |
|---|---|---|
| 6,184,151 B1 | 2/2001 | Adair et al. |
| 6,228,760 B1 | 5/2001 | Yu et al. |
| 6,251,217 B1 | 6/2001 | Ye et al. |
| 6,252,354 B1 | 6/2001 | Collins et al. |
| 6,259,334 B1 | 7/2001 | Howald |
| 6,326,107 B1 | 12/2001 | Watanabe |
| 6,354,240 B1 | 3/2002 | De Ornellas et al. |
| 6,391,794 B1 | 5/2002 | Chen et al. |
| 6,451,705 B1 | 9/2002 | Trapp et al. |
| 6,500,756 B1 | 12/2002 | Bell et al. |
| 6,552,297 B2 | 4/2003 | Blonigan et al. |
| 6,573,030 B1 | 6/2003 | Fairbairn et al. |
| 6,607,984 B1 | 8/2003 | Lee et al. |
| 6,617,794 B2 | 9/2003 | Barnes et al. |
| 6,635,185 B2 | 10/2003 | Demmin et al. |
| 6,635,583 B2 | 10/2003 | Bencher et al. |
| 6,638,855 B1 * | 10/2003 | Chang et al. ............ 438/637 |
| 6,642,149 B2 | 11/2003 | Suemasa et al. |
| 6,790,770 B2 | 9/2004 | Chen et al. |
| 6,864,020 B1 | 3/2005 | Taravade et al. |
| 6,873,397 B2 | 3/2005 | Yabu |
| 6,887,339 B1 | 5/2005 | Goodman et al. |
| 7,375,038 B2 | 5/2008 | Kumar |
| 2001/0013313 A1 * | 8/2001 | Droopad et al. ............ 117/200 |
| 2002/0012851 A1 | 1/2002 | Coronel et al. |
| 2002/0172766 A1 | 11/2002 | Laxman et al. |
| 2002/0177050 A1 | 11/2002 | Tanaka |
| 2002/0197509 A1 | 12/2002 | Carcia et al. |
| 2003/0008069 A1 | 1/2003 | Nemani et al. |
| 2003/0077910 A1 | 4/2003 | Westerman et al. |
| 2003/0091938 A1 | 5/2003 | Fairbairn et al. |
| 2003/0173333 A1 | 9/2003 | Wang et al. |
| 2003/0180631 A1 | 9/2003 | Shiota et al. |
| 2003/0186137 A1 | 10/2003 | Chan |
| 2004/0072081 A1 | 4/2004 | Coleman et al. |
| 2004/0209477 A1 | 10/2004 | Buxbaum et al. |
| 2005/0011862 A1 * | 1/2005 | Sasaki et al. ............ 216/67 |
| 2005/0018604 A1 | 1/2005 | Dropps et al. |
| 2005/0019674 A1 | 1/2005 | Okubo et al. |
| 2005/0078953 A1 | 4/2005 | Fodor et al. |
| 2005/0082007 A1 | 4/2005 | Nguyen et al. |
| 2005/0090118 A1 | 4/2005 | Shannon et al. |
| 2005/0133163 A1 | 6/2005 | Shannon et al. |
| 2005/0175937 A1 | 8/2005 | Bae |
| 2005/0181604 A1 | 8/2005 | Sperlich et al. |
| 2006/0166108 A1 | 7/2006 | Chandrachood et al. |
| 2006/0228473 A1 | 10/2006 | Satah |
| 2007/0023390 A1 | 2/2007 | Kumar |
| 2007/0119373 A1 | 5/2007 | Kumar |
| 2008/0050661 A1 | 2/2008 | Kumar |
| 2008/0131789 A1 | 6/2008 | Kumar |
| 2008/0280212 A9 | 11/2008 | Kumar |

FOREIGN PATENT DOCUMENTS

| | | |
|---|---|---|
| EP | 0 553 704 | 1/1993 |
| EP | 0 840 350 | 5/1998 |
| EP | 1011135 | 6/2000 |
| EP | 1 215 710 | 6/2002 |
| EP | 1 612 840 | 1/2006 |
| JP | 05166915 A | 7/1993 |
| JP | 05275519 A | 10/1993 |
| JP | 06 243992 | 9/1994 |
| JP | 07049558 A | 2/1995 |
| JP | 2001338964 A | 12/2001 |
| JP | 2002351046 A | 12/2002 |
| JP | 2003060008 A | 2/2003 |
| JP | 03 073836 | 3/2003 |
| JP | 2004038154 A | 2/2004 |
| WO | 99 043017 | 8/1999 |
| WO | 03 043061 | 5/2003 |

OTHER PUBLICATIONS

Gwyn, et al., "Extreme Utraviolet Scanning Lithography—Supports Extension of Moore's Law", Issue 11, 8 Pgs.

Prosecution History for U.S. Appl. No. 11/531,055.

Prosecution History for U.S. Appl. No. 11/564,354.

First Chinese Office Action issued Mar. 6, 2009 in Application No. 200610127883.8.

First Chinese Office Action issued Jun. 5, 2009 in Application No. 200610104046.3.

Search Report dated Jun. 10, 2009 for Taiwanese Patent Application No. 95126838.

Office Action in U.S. Appl. No. 11/531,055 dated Aug. 24, 2009.

Official Letter dated Jun. 5, 2009, from Chinese Patent Office for corresponding Chinese Patent application 200610104046.3.

The First Office Action of China Application No. 200610104045.9 dated Sep. 25, 2009.

Extended European Search Report dated Jul. 9, 2008 for EP Application No. 06253960.6.

J. Staples, et al., "High-Efficiency Matching Network for RF-Driven Ion Sources." Proceedings of the 2001 Particle Accelerator Conference, Chicago, IEEE 2001; pp. 2108-2110.

"PCT International Search Report and Written Opinion for PCT/US2004/039081,Applied Materials, Inc., dated Aug. 3, 2005."

Yoda Takashi, et al., "High-Performance SiOF Film Fabricated Using A Dual-Frequency-Plasma Chemical Vapour Deposition System." Japanese Journal of Applied Physics, vol. 43, No. 9A, Sep. 9, 2004, pp. 5984-5989.

Notice of Reasons for Rejection dated Mar. 16, 2010 for Japanese Patent Application No. 2006-208466.

* cited by examiner

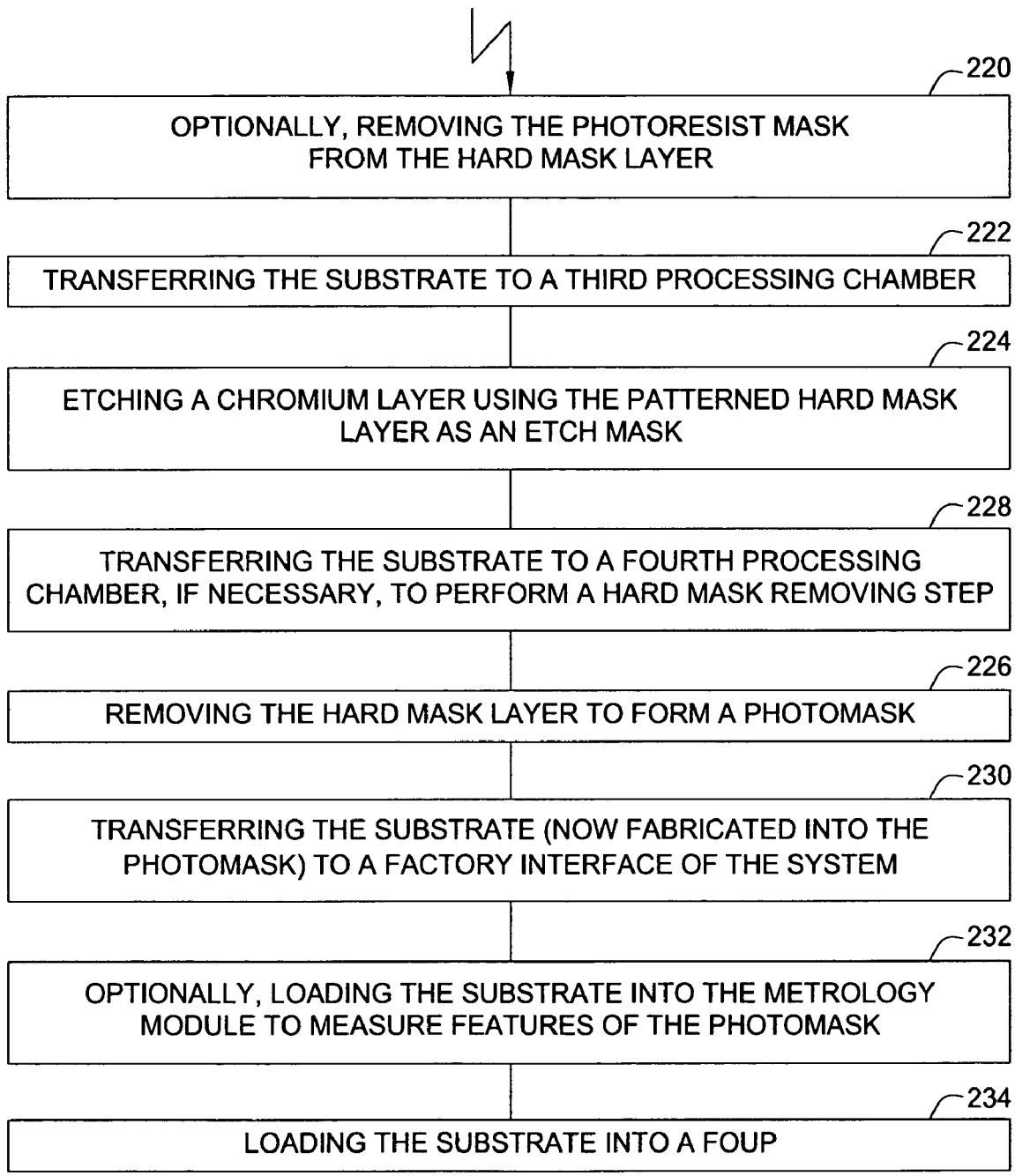
FIG. 2

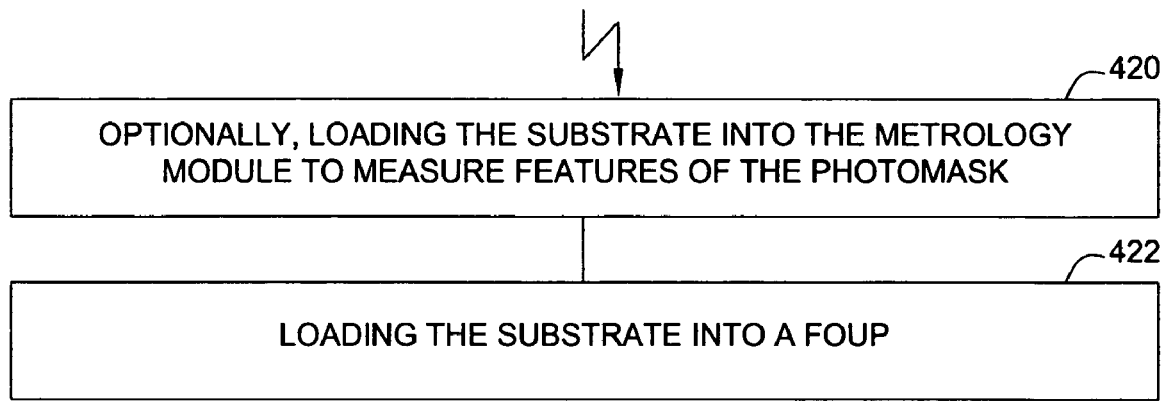

CLUSTER TOOL AND METHOD FOR PROCESS INTEGRATION IN MANUFACTURING OF A PHOTOMASK

BACKGROUND OF THE INVENTION

1. Field of the Invention

The present invention generally relates to a method for photomask fabrication using a hard mask, and to a cluster tool and method for process integration in manufacturing of a photomask.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask is typically a glass or a quartz substrate that has a layer of chromium on one side. The mask may also contain a layer of silicon nitride (SiN) doped with molybdenum (Mb). The chromium layer is covered with an anti-reflective coating and a photosensitive resist. During a patterning process, the circuit design is written onto the mask by exposing portions of the resist to ultraviolet light, making the exposed portions soluble in a developing solution. The soluble portion of the resist is then removed, allowing the exposed underlying chromium to be etched. The etch process removes the chromium and anti-reflective layers from the mask at locations where the resist was removed, i.e., the exposed chromium is removed.

Another mask utilized for patterning is known as a quartz phase shift mask. The quartz phase shift mask is similar to the mask described above, except that alternating adjacent areas of quartz regions exposed through the patterned chromium layer are etched to a depth about equal to half the wavelength of light which will be utilized to transfer the circuit patterns to a substrate during fabrication. Thus, as the light is shown through the quartz phase shift mask to expose resist disposed on the substrate, the light impinging in the resist through one opening in the mask is 180 degrees out of phase relative to the light passing through the immediately adjacent opening. Therefore, light that may be scattered at the edges of the mask opening is cancelled out by the 180 degree light scattering at the edge of the adjacent opening, causing a tighter distribution of light in a predefined region of the resist. The tighter distribution of light facilitates writing of features having smaller critical dimensions. Similarly, masks used for chromeless etch lithography also utilize the phase shift of light passing through quartz portions of two masks to sequentially image the resist, thereby improving the light distribution utilized to develop the resist pattern.

A photoresist etch mask is used during plasma etching of at least one layer during the fabrication of the photomask. As the photoresist is slightly etched during the etching process, dimensional control of the critical dimensions of the photomask layers being etched suffers. In structures having critical dimensions in excess of 10 µm, roughness along the edge of an aperture of the photoresist through which the structure is etched is not of a magnitude to cause significant concern. However, as critical dimensions, particularly of the photomask itself, are reduced below about 5 µm and into the nanometer regime, edge roughness of photoresist apertures is of a magnitude equal to that of the critical dimension itself, and thus, even slight variation is roughness may cause the critical dimensions to become out of specification. Moreover, since etching using a photoresist mask is subject to etch bias (enlargement of the resist aperture during etching), the use of photoresist masks for fabricating critical dimensions less than about 5 µm is extremely challenging to the fabricator as these problems result in non-uniformity of the etched features of the photomask and correspondingly diminishes the ability to produce features having small critical dimensions using the mask. As the critical dimensions of mask continue to shrink, the importance of etch uniformity increases.

Therefore, there is a need in the art for an improved process and apparatus for photomask fabrication. To compliment the improved photomask fabrication process, there is also a need for an improved cluster tool and method for process integration in manufacture of photomasks.

SUMMARY OF THE INVENTION

To improve photomask fabrication, an improved etch process utilizing a masking technique was developed and results in better dimensional control of features formed in a photomask. In order to realize the benefits of the improved etch process, the fabrication process requires additional layers of materials to be deposited and processed as compared to convention tools utilized in photomask fabrication. However, as additional tools and the space consumed by the tools greatly increase the cost of ownership, a system having the capability of performing all of the additional fabrication steps with minimal financial investment is also provided.

In one embodiment, a photomask fabrication process includes patterning a hard mask on a filmstack including chromium, etching the chromium layer through the patterned photomask, in a processing chamber and removing the hard mask within the processing chamber in which the chromium layer was etched.

In other embodiments, a integrated substrate processing system (e.g., cluster tool) and method for process integration in manufacture of a photomask are provided. In one embodiment, a cluster tool suitable for process integration in manufacture of a photomask includes a vacuum transfer chamber having coupled thereto at least one hard mask deposition chamber and at least one plasma chamber configured for etching chromium.

In another embodiment, a method for process integration in manufacture of a photomask includes depositing a hard mask on a substrate in a first processing chamber coupled to a cluster tool, depositing a resist layer on the substrate, patterning the resist layer, etching the hard mask through apertures formed in the patterned resist layer in a second chamber coupled to the cluster tool, and etching a chromium layer through apertures formed in the hard mask in a third chamber coupled to the cluster tool. In a further embodiment of the invention, the hard mask is removed in at least one of the second or third chambers using a plasma formed form an oxygen containing gas.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention include an improved process for photomask fabrication, and an improved cluster tool and method for process integration in manufacture of photomasks. The photomask fabrication method includes forming an ultra-thin hard mask upon a film stack that is processed into a photomask. The film stack generally includes a chromium containing layer and a quartz layer. The film stack may additionally include a light-attenuating layer, such as a layer containing molybdenum. In one embodiment, the hard mask material may be chosen from a material having a high selectivity to the underlying layer being etched, such as quartz and/or chromium containing layers. In another embodiment, the hard mask material may be chosen from a material having an etch rate comparable to that of the underlying layer to be etched through the hard mask. As the hard masks of the present invention are not laterally etched using the chemistries described herein, dimensional stability of apertures formed in the hard mask enable photomask structures having critical dimensions in the order of less than 5 μm and into the nanometer regime to be accurately fabricated.

Figure 1:
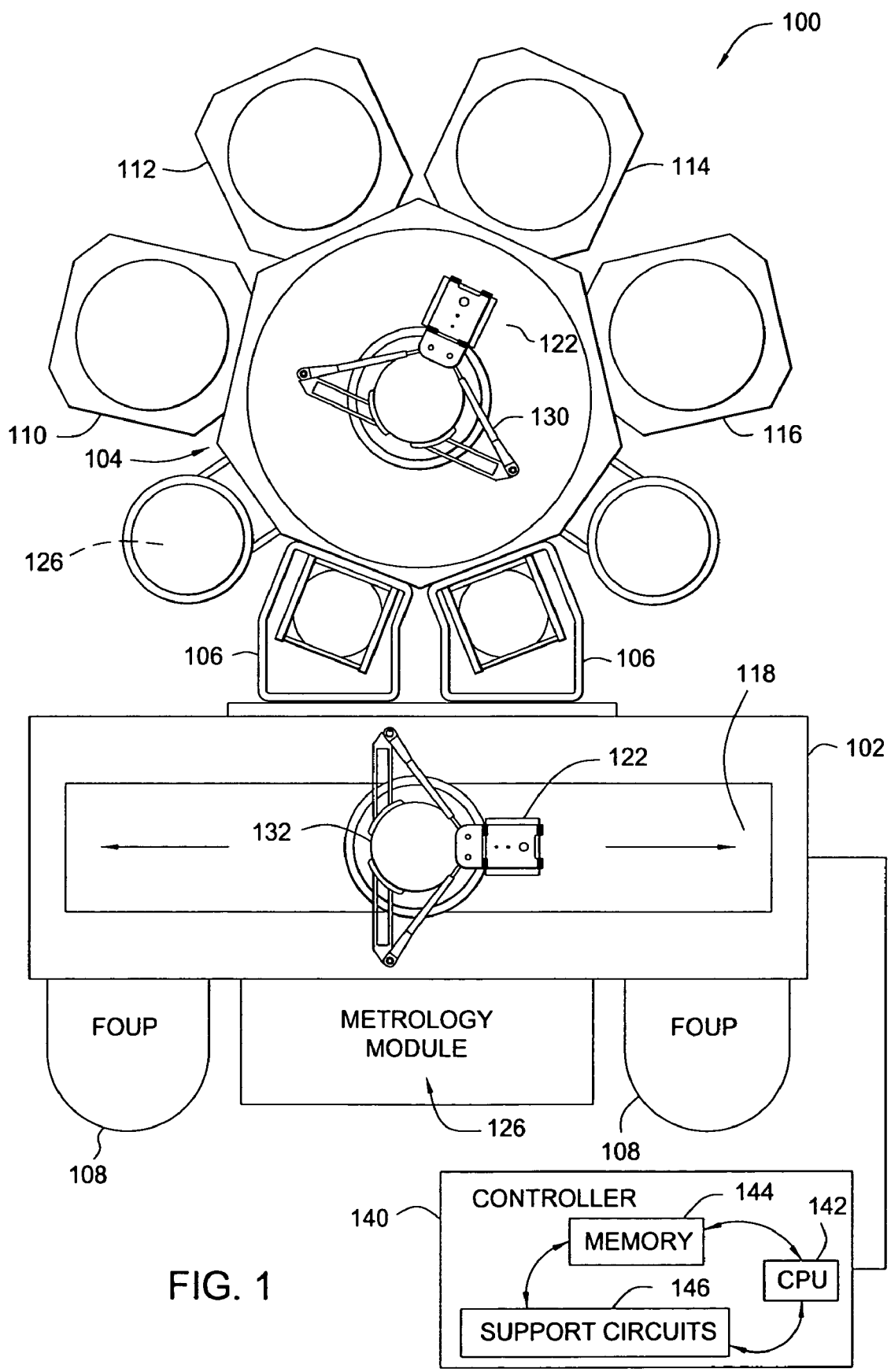
FIG. 1 depicts a schematic view of one embodiment of an integrated semiconductor substrate processing system (e.g., cluster tool) suitable for practicing one embodiment of a method for fabricating a photomask.

FIG. 1 depicts a schematic plan view of an exemplary integrated semiconductor substrate processing system (e.g., cluster tool) 100 suitable for practicing one embodiment of a method for fabricating a photomask of the present invention. The system 100 illustratively includes a vacuum-tight central transfer chamber 104, an input/output module (e.g., factory interface) 102, and a system controller 140. In one embodiment, the transfer chamber 104 includes a plurality of processing chambers and at least one load lock chamber 106 (two are shown in FIG. 1), which are coupled around a periphery of a central transfer chamber 104.

The load lock chambers 106 are utilized to transfer substrates between a substantially atmospheric environment of the factory interface 102 and a vacuum environment of the transfer chamber 104. The transfer chamber 104 has a vacuum robot 130 disposed therein configured to transfer substrates between the load lock chambers 106 and the various process chambers coupled to the transfer chamber 104.

The processing chambers coupled to the transfer chamber 104 generally include at least one etch chamber configured to etch a hard mask, at least one etch chamber configured to etch a chromium layer, and at least one chemical vapor deposition chamber. In one embodiment, at least one of the chemical vapor deposition chamber and the etch chambers, and/or another processing chamber is capable of performing an ashing process, such as removal of the hard mask by exposure to a plasma formed from an oxygen containing gas. In the embodiment depicted in FIG. 1, four processing chambers are coupled to the transfer chamber 104 and include a first chamber 110 configured to deposit a hard mask material, a second chamber 112 configured to etch the hard mask material, a third chamber 114 configured to etch chromium, and a fourth chamber 116 configured to remove the hard mask material. Examples of etch chambers and ashing chambers suitable for use in the invention include TETRA®, TETRA® II, DPS® II, DPS® II HT, and AXIOM™ processing chambers available from Applied Materials, Inc. of Santa Clara, Calif. Exemplary descriptions of respective exemplary embodiments of the processing chambers 110, 112, 114, 116 are discussed below with reference to FIGS. 5-7.

In one embodiment, the factory interface 102 includes a metrology module 126, at least one docking station to accept at least one front opening unified pod (FOUP) 108 and at least one substrate transfer (FI) robot 132. Two FOUPs 108 are shown in the embodiment depicted in FIG. 1. The metrology module 126 employs at least one non-destructive measuring technique suitable for measuring critical dimensions of structures formed on the substrate. One suitable metrology module that may be adapted to benefit from the invention optically measures critical dimensions and is available from Nanometrics, located in Milpitas, Calif. It is contemplated that other measuring tools suitable for measuring critical dimensions may be alternatively employed. The FI robot 132 is configured to transfer pre-processed and post-processed substrates between the FOUPs 108, the metrology module 126, and the load lock chambers 106, and may be positionable along a track 118 to increase the robots range of motion.

Alternatively, the metrology module 126 may be coupled directly to the transfer chamber 104, for example, in place of one of the processing chambers 110, 112, 114, 116, or to another facet of the transfer chamber 104. This configuration facilitates gathering critical dimension data without having to transfer the substrate out of the vacuum environment. It is also contemplated that two or more metrology modules 126 may be utilized, and that at least one metrology module may be positioned in the atmospheric and vacuum sides of the system 100.

The system controller 140 is coupled to and controls the integrated processing system 100. The system controller 140 controls all aspects of operation of the system 100 using a direct control of chamber and apparatus of the system 100 or, alternatively, by controlling the computers (or controllers) associated with these chamber and apparatus. In operation, the system controller 140 enables data collection, along with feedforward and/or feedback of data obtained from the metrology module 126 to optimize the performance of the system 100 and facilitate holding design tolerances of photomask CDs.

The system controller 140 generally includes a central processing unit (CPU) 142, a memory 144, and support circuits 146. The CPU 142 may be one of any form of a general purpose computer processor that can be used in an industrial setting. The support circuits 146 are conventionally coupled to the CPU 142 and may comprise cache, clock circuits, input/output subsystems, power supplies, and the like. The software routines, when executed by the CPU 142, transform the CPU into a specific purpose computer (controller) 140. The software routines may also be stored and/or executed by a second controller (not shown) that is located remotely from the system 100.

Figure 2:
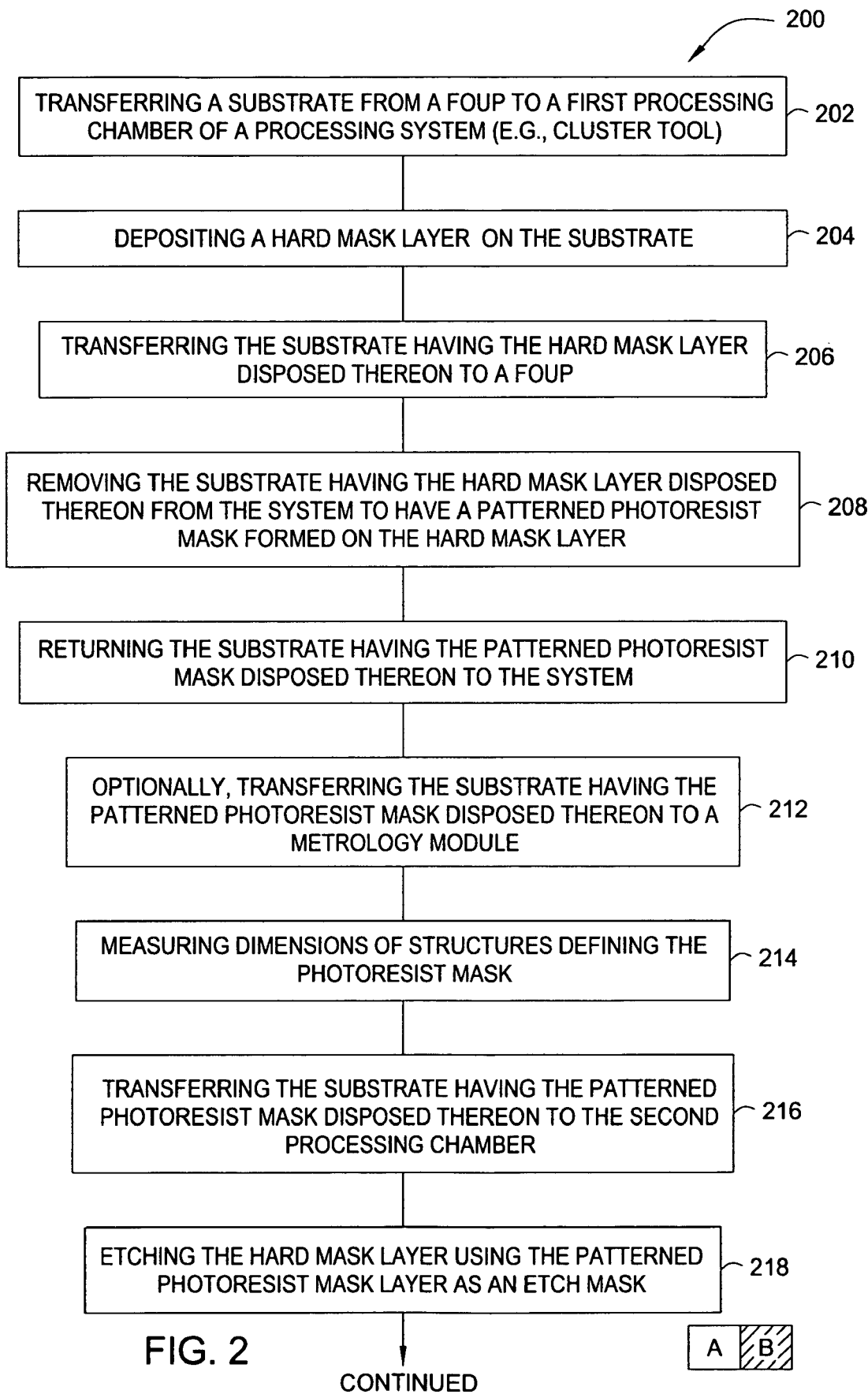
FIG. 2 depicts one embodiment of a flow diagram for a method of fabricating a photomask in accordance with one embodiment of the present invention.

FIG. 2 depicts one embodiment of a flow diagram for a method 200 of fabricating a photomask 320 as shown in FIGS. 3A-G in accordance with one embodiment of the present invention. The method 200 is generally stored in the memory 144, typically as a software routine. Although the method 200 of the present invention is discussed as being implemented as a software routine, some or all of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Figure 3A:
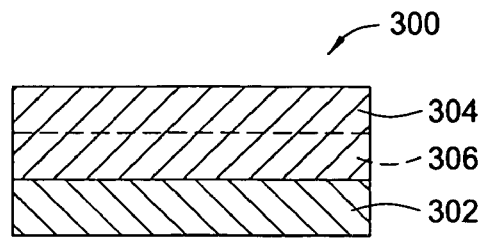
FIGS. 3A-3G depict a series of schematic, partial cross-sectional views of a film stack fabricated into a photomask accordance with the method of FIG. 2.

The method 200 begins at step 202, where a substrate 122 is transferred from one of the FOUP's 108 to the first process chamber 110 through one of the load lock chambers 106. The substrate 122 generally comprises a film stack 300 of the photomask structure being fabricated. The film stack 300 includes an optically transparent silicon based material, such as a quartz (i.e., silicon dioxide ($SiO_2$)) layer 302, having an opaque light-shielding chromium layer 304, known as a photomask material, forming a patterned mask on the surface of the quartz layer 302. The chromium layer 304 may be chromium and/or chromium oxynitride. The substrate 122 may also include an attenuating layer 306 (shown in phantom), such as silicon nitride (SiN) doped with molybdenum (Mo) or molybdenum silicon (MoSi), interposed between the quartz layer 302 and chromium layer 304, as shown in FIG. 3A.

Figure 3B:
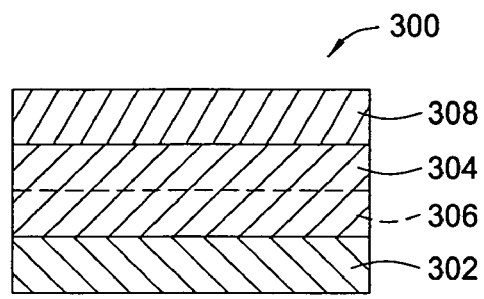

At step 204, a hard mask layer 308 is deposited on the substrate 122 utilizing a chemical vapor depositing process performed in the first processing chamber 110, as shown in FIG. 3B. The hard mask layer 308 has a thickness of, but not limited to, about 50 Å to about 1000 Å. The hard mask layer 308 may be chrome oxynitride, silicon oxynitride, silicon-rich oxide, silicon-rich nitride, silicon-rich oxy-nitride, titanium nitride, molybdenum silicide, and silicon carbide, including: SiC; SiCH; SiCOH; SiCNH; SiCONH; diamond-like carbon, carbon, tungsten, $SiO_2$, and $Si_3N_4$, among other suitable materials. The hard mask layer 308 may also be a high-temperature inorganic carbon material, referred to as α-carbon. One process for depositing α-carbon material is available from Applied Materials, Inc. under the trade name Advanced Patterning Film (APF™). Another α-carbon material is disclosed in commonly assigned U.S. patent application Ser. No. 09/590,322, filed Jun. 8, 2000, which is incorporated by reference in it entirety. The α-carbon material may be further doped with nitrogen ($N_2$) to improve the etch selectivity of the α-carbon material versus other materials used in the film stack 300.

In one embodiment, hard mask layer 308 is deposited by heating a gas mixture comprising one or more hydrocarbon compounds and an inert gas to thermally decompose the one or more hydrocarbon compounds in the gas mixture to form an amorphous carbon layer. Suitable hydrocarbon compounds include gases having the general formula $C_xH_y$, wherein x has a range of 2 to 4 and y has a range of 2 to 10. The gas mixture may be heated to a temperature between about 100 to about 700° C.

In one embodiment, bias power at different frequencies supplied from two power sources may be provided during deposition to engineer the stress of the deposited material, thereby improving the adhesion of the hard mask layer 308 to the underlying film. Particularly, as the critical dimensions of the photomask approach the 45 nm range, poor adherence of the hard mask layer 308 which promotes etch bias will result in unacceptable transfer of CDs from the masking materials to the photomask. For example, a total bias power of up to about 1000 Watts may be provided in a frequency range between about 2 to about 27 MHz. The ratio of power between the higher frequency power source and the lower frequency power source may range from 100 percent to about zero percent, and from about zero percent to about 100 percent. It is also contemplated that the frequency may be tuned to higher and/or lower frequencies, depending on the film stack composition, the hard mask material to be deposited, and the desired stress level in the deposited hard mask film.

In one embodiment, the hard mask layer 308 may include a dielectric anti-reflective coating (DARC) layer used to control the reflection of light during a lithographic patterning process. Typically, the DARC layer comprises silicon dioxide ($SiO_2$), silicon oxynitride (SiON), silicon nitride ($Si_3N_4$), and the like. In one illustrative embodiment, a hard mask layer includes α-carbon film and a DARC layer having a combined thickness of about 1800 Angstroms.

Figure 3C:
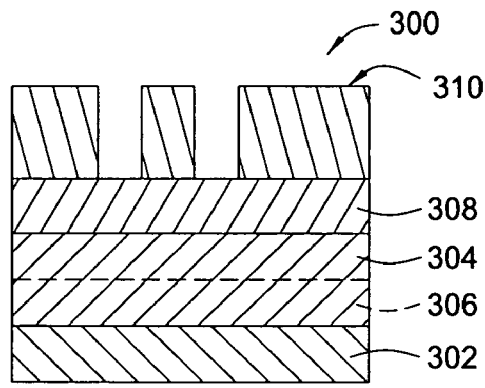

At step 206, the substrate 122 having the hard mask layer 308 disposed thereon is removed from the first processing chamber 110 and transferred back through one of the load lock chambers 106 to one of the FOUP's 108. At step 208, the substrate 122 is removed from the system 100 to have a patterned photoresist mask 310 formed on the hard mask layer 308, as commonly known in the art. At step 210, the substrate 122 having the patterned photoresist mask 310 disposed thereon is returned to the system 100, as shown in FIG 3C.

Optionally, the substrate 122 having the patterned photoresist mask 310 disposed thereon may be transferred from the FOUP 108 to the metrology module 126, at step 212. In the metrology module 126, the dimensions of structures defining the photoresist mask 310 are measured at step 214. To perform the measurements, the measuring tool may use at least non-destructive optical measuring techniques, such as spectroscopy, interferometry, scatterometry, reflectometry, ellipsometry, and the like. The measured dimensions may include topographic dimensions, critical dimensions (CDs), thickness, profile angle, and the like. The term "critical dimensions" refers herein to the minimal widths of the structure of the patterned mask 310 that define the apertures through which the hard mask layer 308 will be etched. The measurements may be performed on each substrate of a batch of the substrates, as well as with pre-defined periodicity. In one embodiment, the metrology module 126 obtains critical dimension measurements of the photoresist mask 310 on each substrate 122. The measurements may be performed in a plurality of regions of the substrate to obtain a statistically valid average CD measurement. The results of these measurements may be used in the integrated semiconductor substrate processing system to determine the recipe of a trimming process, may be used as feedback information for modifying the photoresist mask forming process, or may be used as feedforwad information for modifying the chromium etching process, for monitoring the process performance, quality control, or for other use. Examples of methods for controlling dimensions of the etched features using the pre-trim measurements of the photoresist patterned masks are disclosed in commonly assigned U.S. patent application Ser. No. 10/428, 145, filed May 1, 2003 and U.S. patent application Ser. No 10/666,317, filed Sep. 19, 2003, which are herein incorporated by reference in there entireties. It is contemplated that CD measurements may be taken and used as described above after any of the etching steps described herein.

Figure 3D:
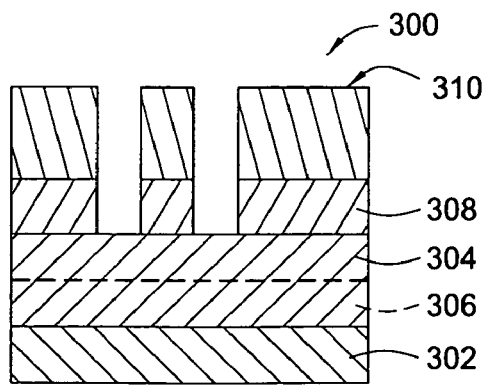

At step 216, the substrate 122 having the patterned photoresist mask 310 disposed thereon is transferred from the FOUP 108 (or metrology module 126) to the second process chamber 112 through one of the load lock chambers 106. At step 218, the hard mask layer 308 is etched using the patterned photoresist mask 310 layer as an etch mask, as shown in FIG. 3D.

In one embodiment wherein the hard mask layer 308 is formed from SiON, the hard mask layer 308 may be etched by providing tetrafluoride ($CF_4$) at a rate of 20 to 200 sccm, argon (Ar) at a rate of 20 to 200 sccm (i.e., a $CF_4$:Ar flow ratio ranging from 1:10 to 10:1), applying power to an inductively coupled antenna between 200 to 1500 W, applying a cathode bias power between 20 and 150 W, and maintaining a wafer temperature between 50 and 200 degrees Celsius at a pressure in the process chamber between 2 and 20 mTorr. One process recipe provides $CF_4$ at a rate of 120 sccm, Ar at a rate of 120 sccm (i.e., a $CF_4$:Ar flow ratio of about 1:1), applies 360 W of power to the antenna, 60 W of a bias power, maintains a wafer temperature of 80 degrees Celsius, and maintains a pressure of 4 mTorr.

In another embodiment wherein the hard mask layer 308 is formed from a carbon-based material, the hard mask layer 308 may be etched by providing hydrogen bromide (HBr) at a rate of 20 to 200 sccm, oxygen ($O_2$) at a rate of 10 to 40 sccm (i.e., a HBr:$O_2$ flow ratio ranging from 1:2 to 20:1), and argon (Ar) at a rate of 20 to 200 sccm, applying power to an inductively coupled antenna between 200 to 1500 W, applying a cathode bias power between 50 and 200 W, and maintaining a wafer temperature between 50 and 200 degrees Celsius at a pressure in the process chamber between 2 and 20 mTorr. One process recipe provides HBr at a rate of 60 sccm, $O_2$ at a rate of 26 sccm, (i.e., a HBr: $O_2$ flow ratio of about 2.3:1), and Ar at a rate of 60 sccm, applies 600 W of power to the antenna, 60 W of a bias power, maintains a wafer temperature of 80 degrees Celsius, and maintains a pressure of 4 mTorr.

Figure 3E:
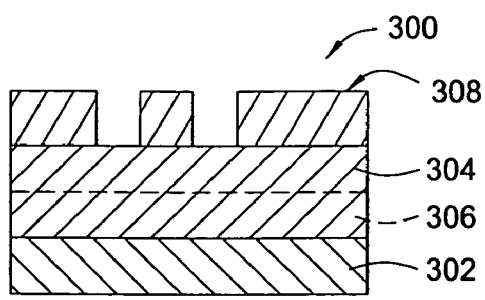

At optional step 220, the photoresist mask 310 is removed from the hard mask layer 308, as shown in FIG. 3E. In one embodiment, the photoresist mask 310 may be removed contemporarily with the etching of the hard mask layer 308 at step 218. In another embodiment, the photoresist mask 310 may be removed in-situ the second processing chamber 112 in that the hard mask etching step 218 was performed. For example, a photoresist mask 310 may be removed in-situ the hard mask etch chamber by exposure to an oxygen containing plasma. In another embodiment, the photoresist mask 310 may be removed in the fourth processing chamber 116 configured as a stripping chamber that provides a plasma containing oxygen, which may be formed with in the processing chamber or provided by a remote plasma source.

The photoresist mask 310 may alternatively be left on the film stack 300. The photoresist mask 310 will eventually be consumed during subsequent etch processes, or be removed with the patterned hard mask layer 308 at step 226 as described below.

Figure 3F:
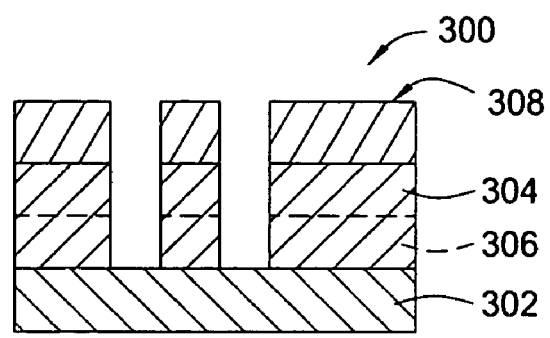
Figure 3G:
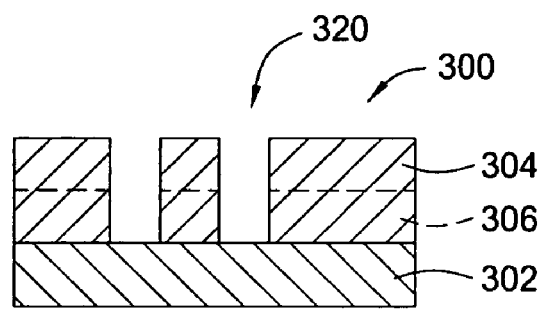

At step 222, the substrate 112 is transferred from the second processing chamber 112 to the third processing chamber 114 wherein the chromium layer 304 is etched using the patterned hard mask layer 308 as an etch mask, at step 224. FIG. 3F depicts the film stack 300 with the chromium layer 304 etched. In one embodiment, the etch step 224 utilizes a plasma formed from one or more halogen containing process gases introduced into the process chamber 114. Exemplary process gases may include one or more of a fluorocarbon gas, $Cl_2$, HBr, HCl, $CF_4$ and $CHF_3$, among others. The processing gas may also include $O_2$. The processing gas may further include an inert gas, such as He, Ar, Xe, Ne, and Kr.

In another embodiment, the chromium layer 304 is etched at step 224 by providing $CF_4$ at a rate of 2 to 50 standard cubic centimeters per minute (sccm) and $CFH_3$ at a rate of 10 to 50 sccm. One specific process recipe provides $CF_4$ at a rate of 9 sccm, $CHF_3$ at a rate of 26 sccm. The pressure in the process chamber is controlled to less than about 40 mTorr, and in one embodiment, between about 1.5 and about 15 mTorr.

In another embodiment of the chromium etch step 224, a pulsed bias power of less than about 600 W is applied to the support pedestal 124 to bias the substrate 122. In a first example, the substrate 112 is biased with a pulsed RF power of less than about 150 W, and in a second example, the substrate 112 is biased with a pulsed RF of about 10 W. The bias power may be pulsed with a frequency and duty cycle as described above, for example, with a frequency in the range of about 1 to about 10 kHz, and with a duty cycle between about 10 to about 95 percent. The pulsed bias power may be DC and/or RF. In another embodiment, the biasing source 140 is provides pulsed RF power between about 10 to about 150 W, at a frequency between about 2 to about 5 kHz, with a duty cycle between about 80 to about 95 percent. In yet another embodiment, the biasing source provides a pulsed RF power of about 10 W.

During step 224, plasma, formed from the process gases, is maintained by applying RF power of between about 250 to about 600 W from the plasma power source 112 to the antenna 110. It is contemplated that the plasma may be ignited by any number of methods.

The chromium layer 304 exposed on the substrate 122 through the patterned hard mask layer 306 is etched until an endpoint is reached. The endpoint may be determined by time, optical interferometry, chamber gas emission spectrography or by other suitable methods.

In another embodiment of the chromium etch step 224, a pulsed bias power of less than about 600 W is applied to the support pedestal to bias the substrate 122. In a first example, the substrate 112 is biased with a plused RF power of less than about 150 W, and in a second example, the substrate 112 is biased with a pulsed RF of about 10 W. The bias power may be pulsed with a frequency and duty cycle as described above, for example, with a frequency in the range of about 1 to about 10 kHz, and with a duty cycle between about 10 to about 95 percent. The pulsed bias power may be DC and/or RF. In another embodiment, the biasing source 140 is provides pulsed RF power between about 10 to about 150 W, at a frequency between about 2 to about 5 kHZ, with a duty cycle between about 80 to about 95 percent. In yet another embodiment, the biasing source provides a pulsed RF power of about 10 W.

During step 224, plasma, formed from the process gases, is maintained by applying RF power of between about 250 to about 600 W from the plasma power source to the antenna. It is contemplated tha the plasma may be ignited by any number of methods.

The chrominum layer 304 exposed on th substrate 122 through the patterned hard mask layer 308 is etched until an endpoint is reached. The endpoint may be determined by time, optical interferometry, chamber gas emission spectrography or by other suitable methods.

At step 226, the hard mask layer 306 is removed to form a photomask 320. In one embodiment, the hard mask layer 306 may be removed contemporarily with the etching of the chromium layer 304 at step 242. For example, a hard mask layer 306 fabricated from SiON will be etched at a rate close to the rate of the chromium layer. Thus, by depositing the SiON hard mask layer to a thickness equal to or slightly greater than a thickness of the chromium layer, substantially all of the SiON hard mask layer will be removed while etching the chromium layer. A short overetch period may be required to clear the remaining hard mask layer 306.

In another embodiment, the hard mask layer 308 may be removed in-situ the third processing chamber 114 in which the etching step 224 was performed. For example, a hard mask layer 308 fabricated from a carbon material may be removed by exposure to an oxygen containing plasma in-situ the third chamber 114 following the chromium layer etch.

In another embodiment, the hard mask layer 308 may be removed in the fourth processing chamber 116 after a transfer step 228. In this embodiment, the fourth processing chamber 116 may be configured as a stripping chamber that provide a plasma containing oxygen, which may be formed within the processing chamber or provided by a remote plasma source.

In an embodiment having an α-carbon hard mask layer 308, the hard mask layer 308 may be removed (or stripped) from the film stack 300 using plasma containing oxygen. In another embodiment, an α-carbon hard mask layer 308 is removed using a plasma formed from hydrogen bromide and oxygen. A $HBr:O_2$ flow ratio may range between about 1:10 to 10:1. Argon may also be present in the plasma. In another embodiment, the plasma is energized with a source power of 200 to 1000 W and a bias power of 0 to 300 W, while the temperature of the substrate is maintained between about 20 to about 80 degrees Celsius. Alternatively, a plasma formed from hydrogen ($H_2$) or a mixture of oxygen and a diluent gas such as argon (Ar) may be used to removed the α-carbon film hard mask layer 308.

After the hard mask removal step 226, the substrate 122 (now fabricated into the photomask 320) is transferred through the load lock chamber 106 to the factory interface 102 at step 230. In the factory interface 102, the substrate 122 is loaded into one of the FOUP's 108 at step 234, or into the metrology module 126 at an optional step 232.

In the metrology module 126 the critical dimensions CDs of the photomask 320 may be measured. CD measurement information may be utilized as a feedback to modify photoresist patterning on incoming substrates for photomask processing, as a feed forward to modify etching and/or lithographic processing on production substrates that utilize the photomask 320, and/or to monitor quality and/or process control, among others. After the metrology step 232, the substrate is loaded into one of the FOUP's 108 at step 232.

Figure 3H:
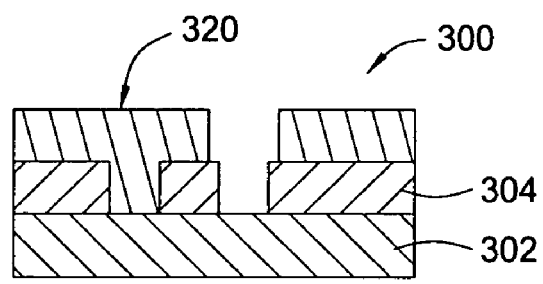
FIGS. 3H-3J depict a series of schematic, partial cross-sectional views of a film stack fabricated into a photomask accordance with a method of FIG. 4.
Figure 3I:
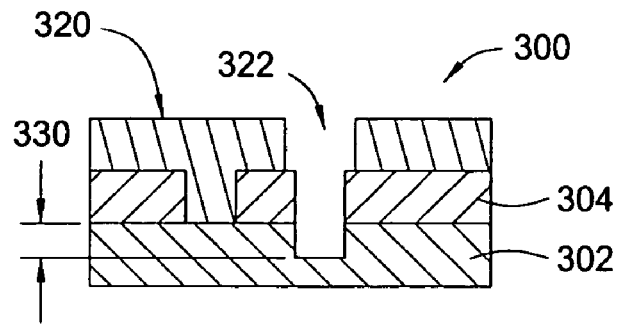
Figure 3J:
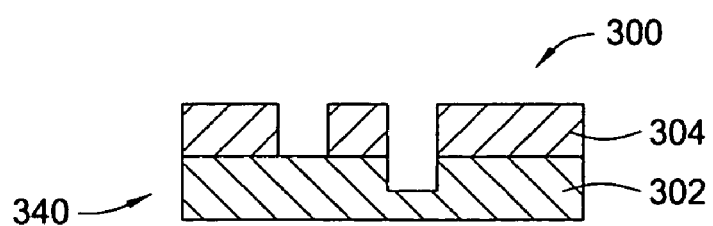
Figure 4:
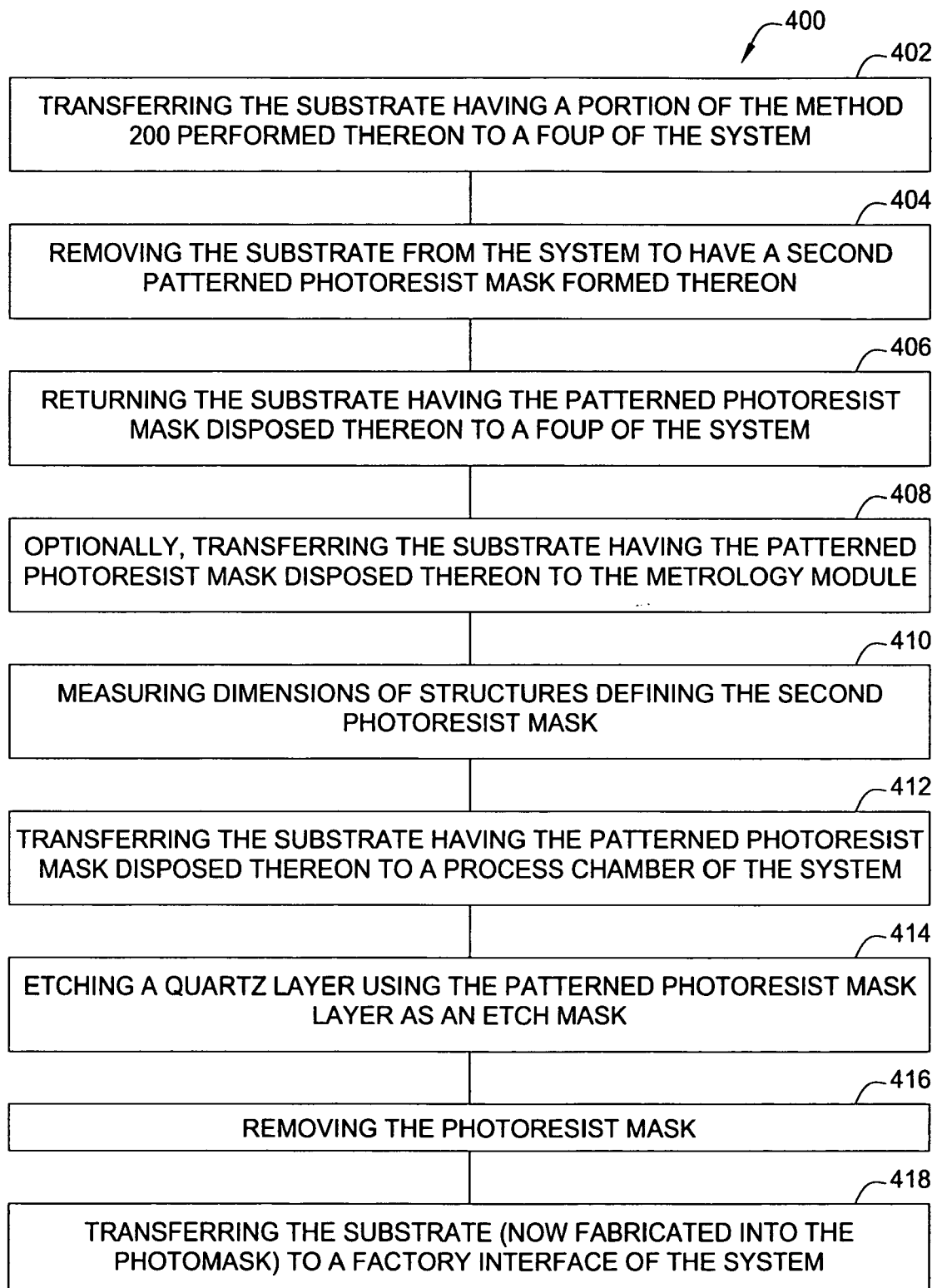
FIG. 4 depicts one embodiment of a flow diagram for another method of fabricating a photomask.
Figure 4:

Optionally, the substrate 112 may be further processed as illustrated in the flow diagram of FIG. 4 that depicts one embodiment of a method 400 of fabricating a phase shift photomask 340 as shown in FIGS. 3G-J in accordance with another embodiment of the present invention. The method 400 may begin after hard mask stripping step 226 or the metrology step 232 of the sequence described in the method 200 above.

The method 400 begins step 402 by transferring the substrate to one of the FOUP's 108. At step 404, the substrate 122 is removed from the system 100 to have a second patterned photoresist mask 321 formed on the film stack 300 as shown in FIG. 3H. At step 406, the substrate 122 having the patterned photoresist mask 320 disposed thereon is returned to the system 100.

Optionally, the substrate 122 having the patterned photoresist mask 320 disposed thereon may be transferred from the FOUP 108 to the metrology module 126, at step 408. In the metrology module 126, the dimensions of structures defining the photoresist mask 320 are measured at step 410. CD measurements of the photoresist mask 320 may be taken and utilized as described above.

At step 412, the substrate 122 having the patterned photoresist mask 320 disposed thereon is transferred from the FOUP 108 (or metrology module 126) to the one of the process chamber 112, 114, 116 through one of the load lock chambers 106. At step 414, the quartz layer 302 is etched using the patterned photoresist mask 320 layer as an etch mask.

In one embodiment, the etch step 414 utilizes a plasma formed from one or more fluorinated process gases. Exemplary process gases may include $CF_4$ and $CHF_3$, among others. The processing gas may further include an inert gas, such as He, Ar, Xe, Ne, and Kr. During etching of the quartz layer 302, the bias power applied to the substrate may be pulsed as described above.

The endpoint of the quartz etch step 414 is selected such that a depth 330 of an etched quartz trench 322 illustrated in FIG. 3I is about equal to the length of 180 degrees phase shift through the quartz layer 302 for a predefined wavelength of light intended for use with the quartz phase shift mask. Typical wavelengths are 193 and 248 nm. Thus, the depth 322 is typically about either 172 or 240 nm, although other depths may be utilized for masks intended for use with different lithographic light wavelengths. After the quartz trench 322 is etched at step 414, the photoresist mask 340 is removed at step 416, for example, by ashing, such that the remaining film stack 300 forms a quartz phase shift mask 320 as shown in FIG. 3J.

After the photoresist mask removal step 416, the substrate 122 (now fabricated into the photomask 340) is transferred through the load lock chamber 106 to the factory interface 102 at step 418. In the factory interface 102, the substrate 122 is loaded into one of the FOUP's 108 at step 424, or into the metrology module 422 at an optional step 230.

In the metrology module 126 the critical dimensions CDs of the photomask 340 may be measured. CD measurement information may be utilized as a feedback to modify photoresist patterning on incoming substrates for photomask processing, as a feed forward to modify etching and/or lithographic processing on production substrates that utilize the photomask 340, and/or to monitor quality and/or process control, among others. After the metrology step 226, the substrate is loaded into one of the FOUP's 108 at step 232.

Figure 5:
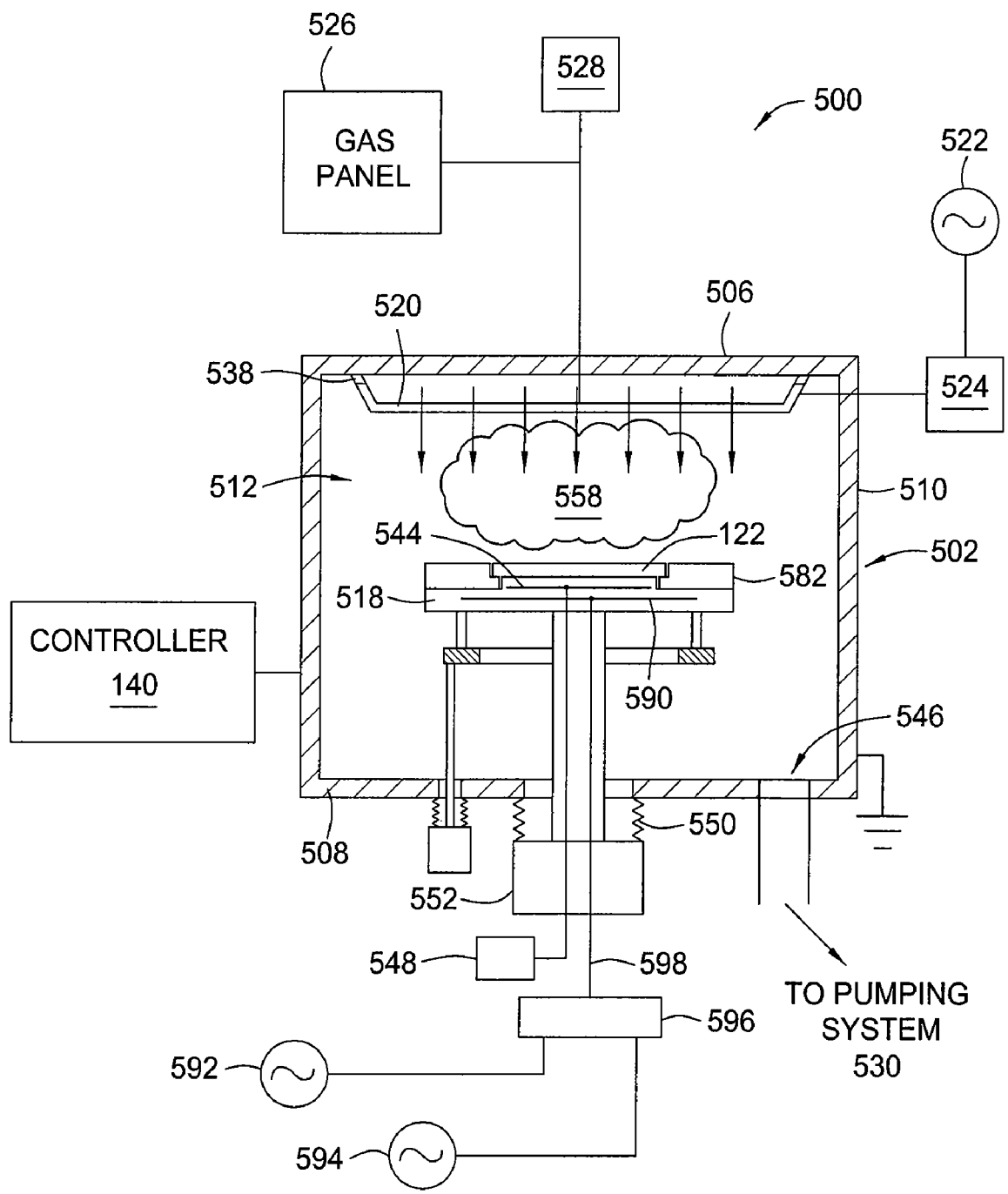
FIG. 5 depicts a schematic cross sectional view of one embodiment of a chemical vapor deposition chamber that may be utilized with the system of FIG. 1.

FIG. 5 depicts a chemical vapor deposition chamber 500 that may be utilized as the first processing chamber 110 in the system 100 of FIG. 1. The chamber 500 coupled to a chamber body 502 having a substrate support 518 disposed within a processing region 512.

The exemplary chamber body 502 generally includes a lid 506, a bottom 508 and sidewalls 510. An exhaust port 546 disposed through the chamber body 502 and couples the processing region 512 to a pumping system 530. Typically, the exhaust port 546 is disposed through the bottom 508 of the chamber body 502, but may be located in other portions of the chamber body 502. The pumping system 530 generally includes a throttle valve and vacuum pump (both not shown) utilized to evacuate interior region 512 of the chamber body 502, remove deposition by-products and control the pressure within the chamber body 502.

A showerhead 520 is coupled to the lid 506 to provide uniform distribution of gas provided from a gas panel 526 to the processing region 512 of the chamber body 502. In one embodiment for depositing a carbon containing head mask layer, the gas panel 526 provided one or more hydrocarbon compounds, or derivatives thereof, to the processing chamber 500. Additionally, oxygen containing and/or fluorine containing compounds may be used. The hydrocarbon compounds may optionally contain nitrogen or be deposited with a nitrogen-containing gas, such as ammonia. Also, the hydrocarbon compounds may have substituents such as fluorine and oxygen. One hydrocarbon compound or its derivative that may be utilized has a formula $C_A H_B O_C F_D$, where A has a range of between 1 and 24, B has a range of between 0 and 50, C has a range of 0 to 10, D has a range of 0 to 50, and the sum of B and D is at least 2.

The showerhead 520 is coupled to an RF power source 522 and matching circuit 524. The power source 522 is generally capable of producing an RF signal having a frequency in the about 10 MHz to about 3 GHz range and a power between about 0 and 10,000 Watts. In one embodiment, the source 522 is capable of producing an RF signal having a frequency of about 60 MHz. The RF energy, supplied by the source 522 to the showerhead 520, is used to facilitate dissociation and ionization of gases in the plasma, which generally facilitates lower processing temperatures with increased deposition rates. A dielectric isolator 538 is disposed between the showerhead 520 and the lid 506 of the chamber body 502 to electrically isolate the RF hot showerhead 520 from the chamber body 502. Plasma enhanced processing also provides additional process flexibility and provides a capability for the system 500 to be used for varied types of deposition processes.

A cleaning agent generator 528 may also be coupled through the showerhead to the processing region 512. In one embodiment, the cleaning agent generator 528 provides a cleaning agent, such as atomic fluorine, that removes unwanted deposition and other contaminants from the chamber components. One such generator is available from Azte Corporation.

The substrate support (cathode) 518 is coupled through a matching network 596 to bias sources 592, 594. The bias sources 592, 594 provide signals having frequencies of between about 50 kHz to about 100 MHz and respective power of between about 0 and about 10,000 Watts. The RF energy, supplied the cource 522 to the showerhead 520, is used to facilitate dissociation and ionization of gases in the plasma, which generally facilitates lower processing temperatures with increased deposition rates. A dielectric isolator 538 is disposed between the showerhead 520 and the lid 506 of the chamber body 502 to electrically isolate the RF hot showerhead 520 from the chamber body 502. Plasma enhanced processing also provides additional process flexibility and provides a capability for the system 500 to be used for varied types of deposition processes.

The electrode 590 is generally coupled to a pair of RF bias sources 592, 594 through a matching network 596. The bias sources 592, 594 are generally capable of producing an RF signal having a frequency of from about 50 kHz to about 27 MHz and a power of between about 0 and about 1,000 Watts. The matching network 596 matches the impedance of the sources 592, 594 to the plasma impedance. A single feed 598 couples energy from both sources to the electrode 590 disposed in the substrate support 518. Alternatively, each source 592, 594 can be coupled to the electrode 590 via a separate feed.

The reticle adapter 582 retains the substrate 122 on the substrate support 518. The reticle adapter 582 may be fabricated from aluminum or aluminum oxide, or other suitable material.

Figure 6:
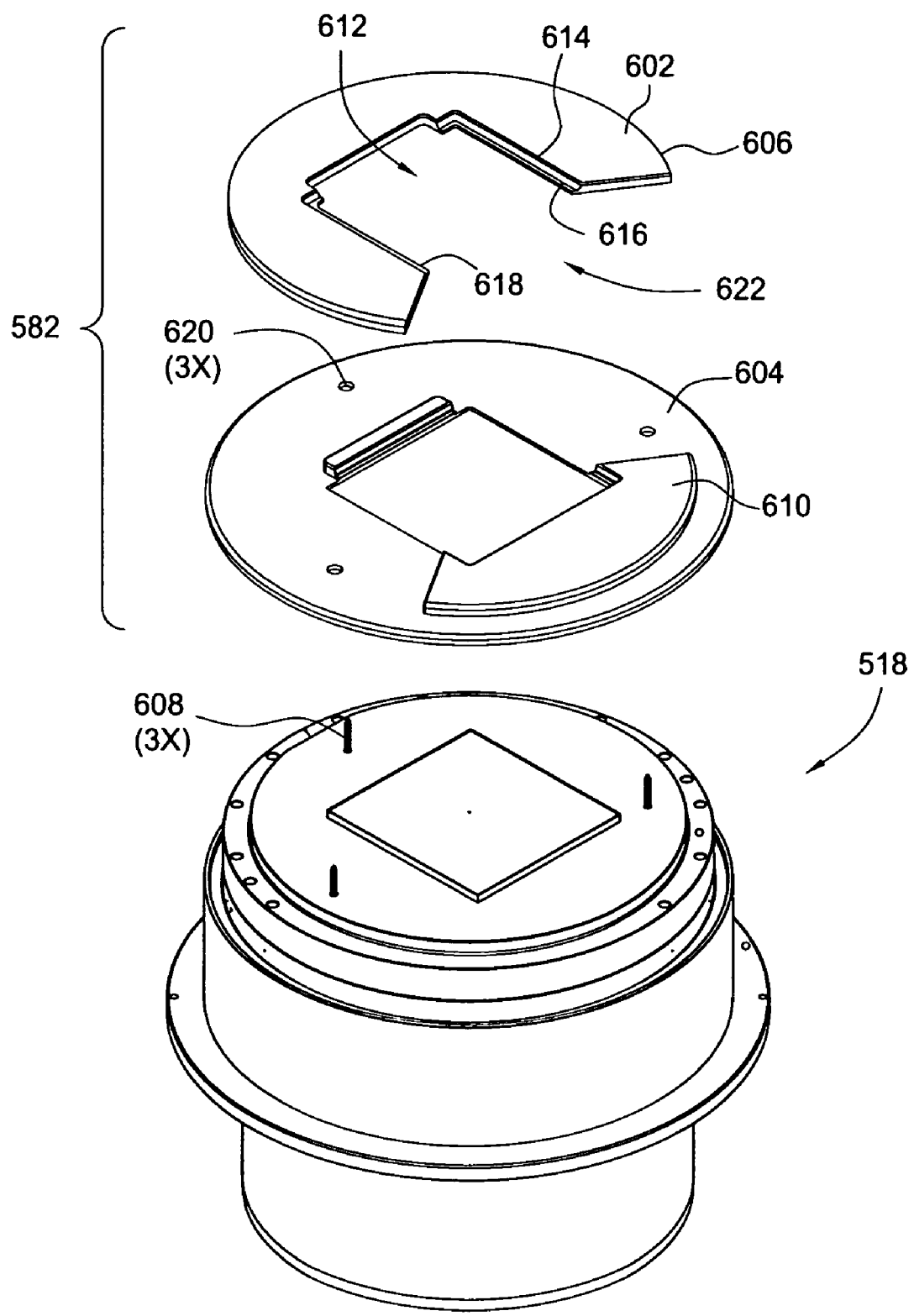
FIG. 6 is a perspective view of a substrate support and reticle adapter of the chemical vapor deposition chamber of FIG. 5.

FIG. 6 depicts a perspective view of one embodiment of a reticle adapter 582. The reticle adapter 582 generally includes a capture ring 602 and a cover ring 604. Together, the capture ring 602 and the cover ring 604 define a substrate receiving pocket 612.

The cover ring 604 generally covers and protects the upper surface of the substrate support 518 from deposition. The cover ring 604 includes a plurality of holes 620 that allow lift pins 608 to selectively project therethrough, thereby lifting the capture ring 604 from the cover ring 602. The cover ring 602 a raised alignment feature 610 that functions both the provide one boundary of the substrate receiving pocket 612 and an alignment feature that engages the capture ring 602 when the capture ring is in a lower position.

The capture ring 602 includes an arcuate base plate 606 having general "C-shape" having an inner edge 614 that defines a portion of the substrate receiving pocket 612. One or more of substrate supports, such as support ledges 616, 618 are disposed on the inner edge 614. The substrate supports ledges 616, 618 allow the capture ring 602 to lift the substrate 122 from the cover ring 602 when lifted by the lift pins 608. An open end 622 of "C-shape" base plate 606 facilitates the blade of a robot (not shown) to exchange the substrate 122 with the raised capture ring 602.

Returning to FIG. 5, the substrate support 518 is coupled to a lift mechanism 552 that controls the elevation of the substrate support 518 relative to the showerhead 520. The substrate support 518 may be lowered by the lift mechanism 552 to facilitate substrate transfer through substrate access port (not shown) disposed in the sidewalls 510 of the chamber body 502. Conversely, the substrate support 518 may be raised towards the showerhead 520 to set a gap (or spacing) between the substrate 122 and the showerhead 520. Bellows 550 are coupled between the lift mechanism 552 and the chamber bottom 508 to prevent vacuum leakage.

In operation, the substrate 122 is disposed in the processing chamber 500 on the substrate support 518. A process gas is introduced into the chamber body 502 through the showerhead 520 from the gas panel 526. In one embodiment, the RF source 522 provides about 600 Watts of RF voltage at 13.56 MHz to the showerhead 520, thereby exciting the gas inside the chamber body 502 and forming a plasma 599. The RF bias source 592 is selected to generate power at a frequency of about 2 MHz and the RF bias source 594 is selected to generate power at a frequency of about 13.56 MHz. The RF bias sources bias sources 592, 594 provide up to about 1,000 Watts of total RF power in a predetermined power ratio from the bias source 592 to the bias source 594 of between 1:0 and 0:1. These RF bias sources 592, 594 provide bias power that both self-biases the substrate and modulates the plasma sheath.

Adjusting the ratio between the bias sources 592, 594 controls the characteristics of the plasma, which enables the properties of the deposited film to be engineered. For example, a SiON or carbon containing hard mask layer may be deposited in a manner that reduces the stress of the deposited film, thereby improving adhesion between the hard mask film and an underlying layer, such as a chromium containing layer. One carbon containing hard mask layer deposition process that may be adapted to benefit from the application of dual frequency bias is described in U.S. patent application Ser. No. 11/065,464, filed Feb. 24, 2005, which is incorporated by reference in its entirety.

In one embodiment, the frequencies on the electrode 590 are selected such that they are of a low enough frequency so as to provide a strong self-biasing sheath in the plasma discharge above the powered surface. The first frequency provides a broad ion energy distribution (i.e., lower frequency). The second frequency provides a peaked, well defined ion energy distribution (i.e., higher frequency). Typically, the first frequency is selected such that it's cycle time is much larger than the transit time of an ion in the sheath, while the second frequency is selected such that it's period approaches or surpasses the transit time of the ion in the sheath. These frequencies are also selected such that when used in conjunction with a third power source provided by an independently driven electrode (e.g., the showerhead 520), they are not the primary power contributor for plasma ionization and dissociation.

The combined applied voltage of the two frequency sources is used to control the peak-to-peak sheath voltage as well as the self-biased DC potential that is used for driving the deposition process. The mixing of the two frequencies is used to tune the energy distribution about this average acceleration generated by this DC potential. Thus, utilizing a plasma enhanced processing chamber with a dual frequency cathode as described above, the ion energy distribution within the plasma can be controlled in a manner that enables film properties, such as stress and adherence, to be engineered by tuning the bias frequency.

Figure 7:
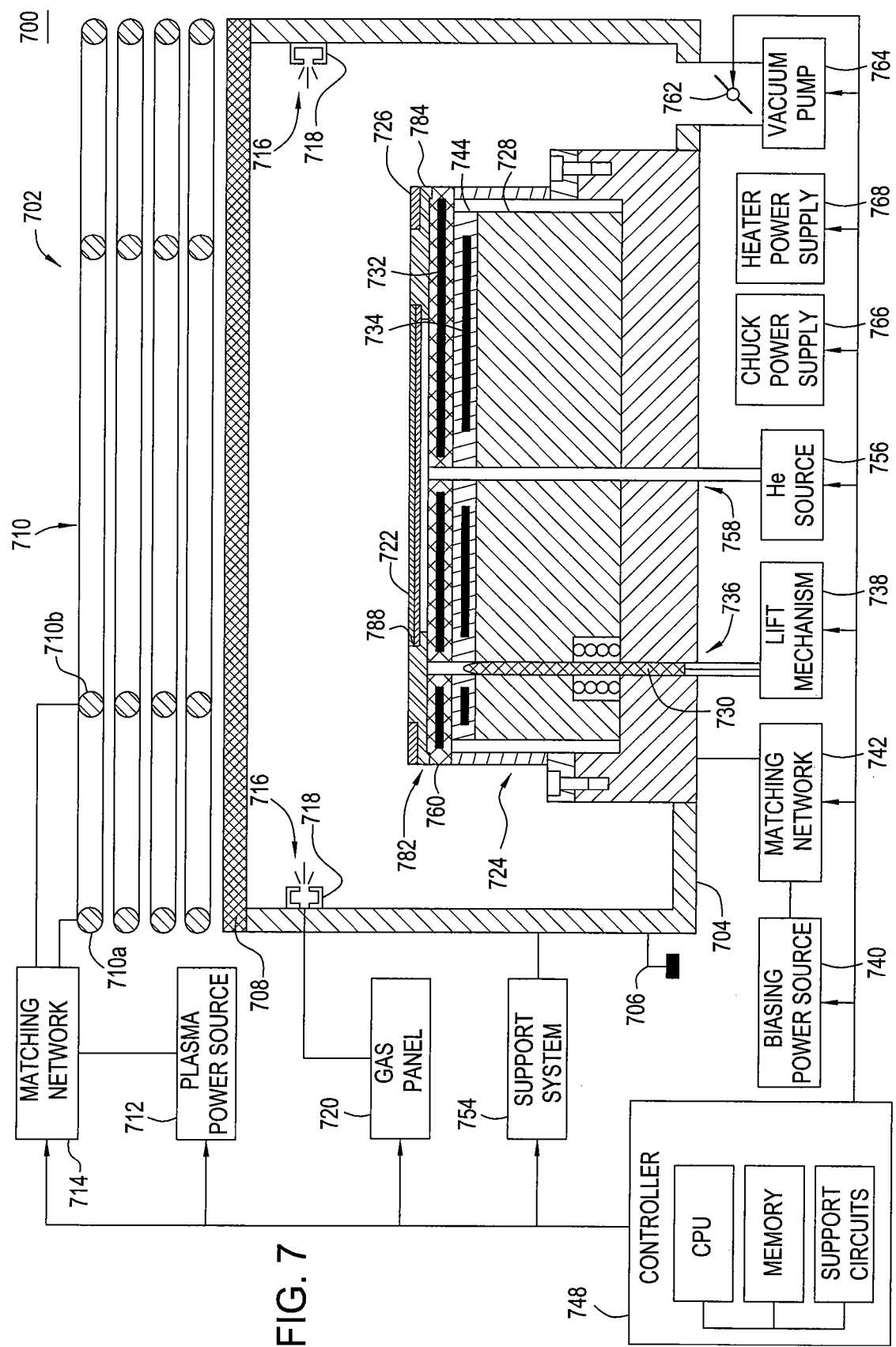
FIG. 7 depicts a schematic cross sectional view of one embodiment of an etch reactor that may be utilized with the system of FIG. 1.

FIG. 7 depicts a schematic diagram of one embodiment of an etch reactor 700 suitable for use as one of the processing chambers 712, 714, 716. Suitable reactors that may be adapted for use with the teachings disclosed herein include, for example, the Decoupled Plasma Source (DPS®) II reactor, or the Tetra I and Tetra II Photomask etch systems, all of which are available from Applied Materials, Inc. of Santa Clara, Calif. The particular embodiment of the etch reactor 700 shown herein is provided for illustrative purposes and should not be used to limit the scope of the invention.

The etch reactor 700 generally comprises a process chamber 702 having a substrate pedestal 724 within a conductive body (wall) 704, and a controller 746. The chamber 702 has a substantially flat dielectric ceiling 708. Other modifications of the chamber 702 may have other types of ceilings, e.g., a dome-shaped ceiling. An antenna 710 is disposed above the ceiling 708. The antenna 710 comprises one or more inductive coil elements that may be selectively controlled (two co-axial elements 710a and 710b are shown in FIG. 7). The antenna 710 is coupled through a first matching network 714 to a plasma power source 712. The plasma power source 712 is typically capable of producing up to about 3000 Watts (W) at a tunable frequency in a range from about 50 kHz to about 13.56 MHz. In one embodiment, the plasma power source 712 provides about 300 to about 600 W of inductively coupled RF power.

The substrate pedestal (cathode) 724 is coupled through a second matching network 742 to a biasing power source 740. The biasing source 740 provides between about zero to about 600 W at a tunable pulse frequency in the range of about 1 to about 10 kHz. The biasing source 740 produces pulsed RF power output. Alternatively, the biasing source 740 may produce pulsed DC power output. It is contemplated that the source 740 may also provide a constant power output.

In one embodiment, the biasing source 740 is configured to provide RF power less than about 700 Watts at a frequency between about 1 to about 10 kHz, with a duty cycle between about 10 to about 95 percent. In another embodiment, the biasing source 740 is configured to provide RF power between about 20 to about 150 Watts, at a frequency between about 2 to about 5 kHz, with a duty cycle between about 80 to about 95 percent.

In one embodiment as in a DPS® II reactor, the substrate support pedestal 724 may include an electrostatic chuck 760. The electrostatic chuck 760 comprises at least one clamping electrode 732 and is controlled by a chuck power supply 766. In alternative embodiments, the substrate pedestal 724 may comprise substrate retention mechanisms such as a susceptor clamp ring, a mechanical chuck, and the like.

A gas panel 720 is coupled to the process chamber 702 to provide process and/or other gases to the interior of the process chamber 702. In the embodiment depicted in FIG. 7, the gas panel 720 is coupled to one or more inlets 716 formed in a channel 718 in the sidewall 704 of the chamber 702. It is contemplated that the one or more inlets 716 may be provided in other locations, for example, in the ceiling 708 of the process chamber 702.

In one embodiment, the gas panel 720 is adapted to provide fluorinated process gas through the inlets 716 and into the interior of the process chamber 702. During processing, a plasma is formed from the process gas and maintained through inductive coupling of power from the plasma power source 712. The plasma may alternatively be formed remotely or ignited by other methods. In one embodiment, the process gas provided from the gas panel 720 includes at least $CHF_3$ and/or $CF_4$. Other fluorinated gases may include one or more of $C_2F$, $C_4F_6$, $C_3F_8$ and $C_5F_8$.

The pressure in the chamber 702 is controlled using a throttle valve 762 and a vacuum pump 764. The vacuum pump 764 and throttle valve 762 are capable of maintaining chamber pressures in the range of about 1 to about 20 mTorr.

The temperature of the wall 704 may be controlled using liquid-containing conduits (not shown) that run through the wall 704. Wall temperature is generally maintained at about 65 degrees Celsius. Typically, the chamber wall 704 is formed from a metal (e.g., aluminum, stainless steel, and the like) and is coupled to an electrical ground 706. The process chamber 702 also comprises conventional systems for process control, internal diagnostic, end point detection, and the like. Such systems are collectively shown as support systems 754.

A reticle adapter 782 is used to secure a substrate (such as a reticle or other workpiece) 722 onto the substrate support pedestal 724. The reticle adapter 782 generally includes a lower portion 784 milled to cover an upper surface of the pedestal 724 (for example, the electrostatic chuck 760) and a top portion 786 having an opening 788 that is sized and shaped to hold the substrate 722. The opening 788 is generally substantially centered with respect to the pedestal 724.

The adapter 782 is generally formed from a single piece of etch resistant, high temperature resistant material such as polyimide ceramic or quartz. A suitable reticle adapter is disclosed in U.S. Pat. No. 6,251,217, issued on Jun. 26, 2001, and incorporated herein by reference. An edge ring 726 may cover and/or secure the adapter 782 to the pedestal 724.

A lift mechanism 738 is used to lower or raise the adapter 782, and hence, the substrate 722, onto or off of the substrate support pedestal 724. Generally, the lift mechanism 738 comprises a plurality of lift pins (one lift pin 730 is shown) that travel through respective guide holes 736.

In operation, the temperature of the substrate 722 is controlled by stabilizing the temperature of the substrate pedestal 724. In one embodiment, the substrate support pedestal 724 comprises a heater 744 and an optional heat sink 728. The heater 744 may be one or more fluid conduits configured to flow a heat transfer fluid therethrough. In another embodiment, the heater 744 may include at least one heating element 734 that is regulated by a heater power supply 768. Optionally, a backside gas (e.g., helium (He)) from a gas source 756 is provided via a gas conduit 758 to channels that are formed in the pedestal surface under the substrate 722. The backside gas is used to facilitate heat transfer between the pedestal 724 and the substrate 722. During processing, the pedestal 724 may be heated by the embedded heater 744 to a steady-state temperature, which in combination with the helium backside gas, facilitates uniform heating of the substrate 722.

Figure 8:
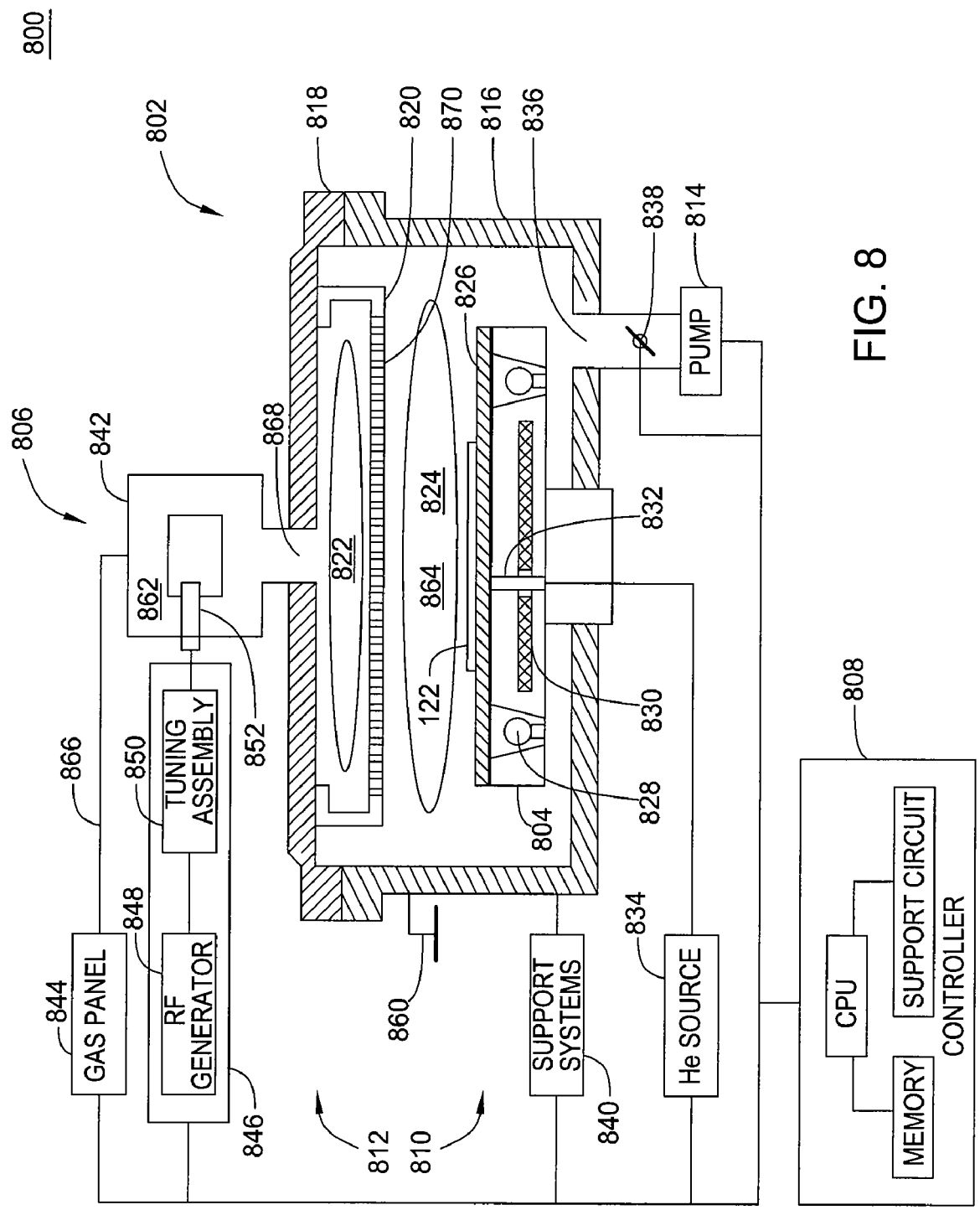
FIG. 8 depicts a schematic cross sectional view of one embodiment of a ashing reactor that may be utilized with the system of FIG. 1.

FIG. 8 depicts a schematic diagram of an exemplary ashing reactor 800 of the kind that may be used as a fourth 114 processing chamber when a dedicated chamber for mask removal is desired. An example of a suitable ashing reactor is described in detail in U.S. patent application Ser. No. 10/264, 664, filed Oct. 4, 2002, which is herein incorporated by reference. Salient features of the reactor 800 are briefly described below.

The reactor 800 reactor comprises a process chamber 802, a remote plasma source 806, and a controller 808. The process chamber 802 generally is a vacuum vessel, which comprises a first portion 810 and a second portion 812. In one embodiment, the first portion 810 comprises a substrate pedestal 804, a sidewall 816 and a vacuum pump 814. The second portion 812 comprises a lid 818 and a gas distribution plate (showerhead) 820, which defines a gas mixing volume 822 and a reaction volume 824. The lid 818 and sidewall 816 are generally formed from a metal (e.g., aluminum (Al), stainless steel, and the like) and electrically coupled to a ground reference 860.

The substrate pedestal 804 supports a substrate (wafer) 826 within the reaction volume 824. In one embodiment, the substrate pedestal 804 may comprise a source of radiant heat, such as gas-filled lamps 828, as well as an embedded resistive heater 830 and a conduit 832. The conduit 832 provides a gas (e.g., helium) from a source 834 to the backside of the wafer 826 through grooves (not shown) in the wafer support surface of the pedestal 804. The gas facilitates heat exchange between the support pedestal 804 and the wafer 826. The temperature of the wafer 826 may be controlled between about 20 and 400 degrees Celsius.

The vacuum pump 814 is adapted to an exhaust port 836 formed in the sidewall 816 of the process chamber 802. The vacuum pump 814 is used to maintain a desired gas pressure in the process chamber 102, as well as evacuate the post-processing gases and other volatile compounds from the chamber. In one embodiment, the vacuum pump 814 comprises a throttle valve 838 to control a gas pressure in the process chamber 802.

The process chamber 802 also comprises conventional systems for retaining and releasing the wafer 826, detecting an end of a process, internal diagnostics, and the like. Such systems are collectively depicted as support systems 840.

The remote plasma source 806 comprises a power source 846, a gas panel 844, and a remote plasma chamber 842. In one embodiment, the power source 846 comprises a radio-frequency (RF) generator 848, a tuning assembly 850, and an applicator 852. The RF generator 848 is capable of producing of about 200 to 5000 W at a frequency of about 200 to 700 kHz. The applicator 852 is inductively coupled to the remote plasma chamber 842 and energizes a process gas (or gas mixture) 864 to a plasma 862 in the chamber. In this embodiment, the remote plasma chamber 842 has a toroidal geometry that confines the plasma and facilitates efficient generation of radical species, as well as lowers the electron temperature of the plasma. In other embodiments, the remote plasma source 806 may be a microwave plasma source, however, the stripping rates are generally higher using the inductively coupled plasma.

The gas panel 844 uses a conduit 866 to deliver the process gas 864 to the remote plasma chamber 842. The gas panel 844 (or conduit 866) comprises means (not shown), such as mass flow controllers and shut-off valves, to control gas pressure and flow rate for each individual gas supplied to the chamber 842. In the plasma 862, the process gas 864 is ionized and dissociated to form reactive species.

The reactive species are directed into the mixing volume 822 through an inlet port 868 in the lid 818. To minimize charge-up plasma damage to devices on the wafer 826, the ionic species of the process gas 864 are substantially neutralized within the mixing volume 822 before the gas reaches the reaction volume 824 through a plurality of openings 870 in the showerhead 820.

While the foregoing is directed to the illustrative embodiment of the present invention, other and further embodiments of the invention may be devised without departing from the basic scope thereof, and the scope thereof is determined by the claims that follow.

What is claimed is:

1. A method of fabricating a photomask, comprising:
transferring a substrate in a processing system having a first processing chamber and a second processing chamber coupled to a transfer chamber having a vacuum environment to the first processing chamber, the substrate comprising a film stack having a quartz layer, chromium layer disposed on the quartz layer, a hardmask layer disposed on the chromium layer, and a patterned photoresist layer formed on the hardmask layer;
etching the hard mask layer using the patterned photoresist layer as an etch mask in the first processing chamber;
etching the chromium layer using the patterned hard mask layer as an etch mask in the second processing chamber;
removing the hard mask layer in-situ the second processing chamber;
forming a second patterned photoresist layer on the chromium layer;
etching apertures through the chromium layer to expose the quartz layer using the second patterned photoresist layer as an etch mask; and
etching the quartz layer through the apertures formed through the chromium layer to form a quartz phase shift photomask.

2. The method of claim 1, further comprising:
measuring critical dimensions of a first feature formed on the photoresist layer using a metrology module residing within the system; and
measuring a critical dimension of a second feature formed on at least one of the hard mask layer or the chromium layer.

3. The method of claim 1, wherein the removing the hard mask layer in-situ the second processing chamber further comprises:
consuming the hard mask layer using a plasma containing oxygen after etching the chromium layer.

* * * * *

UNITED STATES PATENT AND TRADEMARK OFFICE
CERTIFICATE OF CORRECTION

PATENT NO. : 7,829,471 B2
APPLICATION NO. : 11/192989
DATED : November 9, 2010
INVENTOR(S) : Kumar It is certified that error appears in the above-identified patent and that said Letters Patent is hereby corrected as shown below:

In the Detailed Description:

Column 8, Line 11, please delete "112" and insert --122-- therefor;

Column 8, Lines 30-55, please delete "In another embodiment of the chromium etch step 224, a pulsed bias power of less than about 600 W is applied to the support pedestal 124 to bias the substrate 122. In a first example, the substrate 112 is biased with a pulsed RF power of less than about 150 W, and in a second example, the substrate 112 is biased with a pulsed RF of about 10 W. The bias power may be pulsed with a frequency and duty cycle as described above, for example, with a frequency in the range of about 1 to about 10 kHz, and with a duty cycle between about 10 to about 95 percent. The pulsed bias power may be DC and/or RF. In another embodiment, the biasing source 140 is provides pulsed RF power between about 10 to about 150 W, at a frequency between about 2 to about 5 kHz, with a duty cycle between about 80 to about 95 percent. In yet another embodiment, the biasing source provides a pulsed RF power of about 10 W.
  During step 224, plasma, formed from the process gases, is maintained by applying RF power of between about 250 to about 600 W from the plasma power source 112 to the antenna 110. It is contemplated that the plasma may be ignited by any number of methods.
  The chromium layer 304 exposed on the substrate 122 through the patterned hard mask layer 306 is etched until an endpoint is reached. The endpoint may be determined by time, optical interferometry, chamber gas emission spectrography or by other suitable methods.";

Column 8, Line 59, please delete "112" and insert --122-- therefor;

Column 8, Line 60, please delete "112" and insert --122-- therefor;

Column 9, Line 15, please delete "306" and insert --308-- therefor;

Column 9, Line 16, please delete "306" and insert --308-- therefor;

Signed and Sealed this
Eighth Day of February, 2011

David J. Kappos
*Director of the United States Patent and Trademark Office*

CERTIFICATE OF CORRECTION (continued)
U.S. Pat. No. 7,829,471 B2

Column 9, Line 19, please delete "306" and insert --308-- therefor;

Column 9, Line 20, please delete "SION" and insert --SiON-- therefor;

Column 9, Line 25, please delete "306" and insert --308-- therefor;

Column 11, Line 60, please delete "cource" and insert --source-- therefor.

Column 15, Line 31, please delete "114" and insert --116-- therefor;

Column 15, Line 66, please delete "102" and insert --802-- therefor;